US008607118B2

(12) United States Patent
No et al.

(10) Patent No.: US 8,607,118 B2
(45) Date of Patent: Dec. 10, 2013

(54) ITERATIVE DECODING METHOD AND APPARATUS

(75) Inventors: Jong Seon No, Seoul (KR); Beom Kyu Shin, Seoul (KR); Seok Il Youn, Seoul (KR); Jae Dong Yang, Seoul (KR); Jun Jin Kong, Yongin-si (KR); Jae Hong Kim, Seoul (KR); Yong June Kim, Seoul (KR); Kyoung Lae Cho, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 706 days.

(21) Appl. No.: 12/475,640

(22) Filed: Jun. 1, 2009

(65) Prior Publication Data

US 2009/0307566 A1 Dec. 10, 2009

(30) Foreign Application Priority Data

Jun. 5, 2008 (KR) ........................ 10-2008-0053150

(51) Int. Cl.
*H03M 13/00* (2006.01)

(52) U.S. Cl.
USPC .......................................... 714/755

(58) Field of Classification Search
USPC .......................................... 714/755
See application file for complete search history.

(56) References Cited

U.S. PATENT DOCUMENTS

| 7,770,090 | B1 * | 8/2010 | Kons et al. ..................... 714/780 |
| 2001/0039636 | A1 * | 11/2001 | Hammons et al. ............. 714/752 |
| 2003/0028838 | A1 * | 2/2003 | Chang et al. ................... 714/755 |
| 2003/0226087 | A1 * | 12/2003 | Cameron et al. .............. 714/755 |
| 2005/0257116 | A1 * | 11/2005 | Zarrinkhat et al. ........... 714/755 |
| 2007/0094470 | A1 * | 4/2007 | Haustein et al. .............. 711/163 |
| 2008/0294963 | A1 * | 11/2008 | Hwang ......................... 714/755 |
| 2009/0019335 | A1 * | 1/2009 | Boyer et al. ................... 714/755 |
| 2009/0024905 | A1 * | 1/2009 | Shalvi et al. ................... 714/773 |
| 2009/0113256 | A1 * | 4/2009 | Radosavljevic et al. ...... 714/699 |

FOREIGN PATENT DOCUMENTS

| JP | 2003198513 A | 7/2003 |
| KR | 1020000046034 A | 7/2000 |
| KR | 100738983 B1 | 7/2007 |

* cited by examiner

*Primary Examiner* — Shelly A Chase
*Assistant Examiner* — Enam Ahmed
(74) *Attorney, Agent, or Firm* — Volentine & Whitt, PLLC

(57) ABSTRACT

An iterative decoding method is disclosed and includes sequentially executing a number of iterative decoding cycles in relation to a parity check equation until the parity check equation is resolved, or a maximum number N of iterative decoding cycles is reached, during execution of the number of iterative decoding cycles, storing in a data buffer minimum estimated values for a set of variable nodes corresponding to a minimum number of bit errors, and outputting the minimum estimated values stored in the data buffer as a final decoding result when the number of iterative decoding cycles reaches N.

20 Claims, 6 Drawing Sheets

ITERATIVE DECODING METHOD AND APPARATUS

BACKGROUND

The present invention relates generally to error correction technology. More particularly, the invention relates to an iterative decoding method and apparatus that use certain statistical characteristics derived from a number of check nodes not satisfying a parity check equation, and a number of error bits. The present invention also relates to recording medium having recorded thereon a computer program which when executed implements the foregoing iterative decoding method.

Iterative decoding algorithms have been used for many decades in various technical applications. Consider for example the well known iterative decoding algorithm proposed by Gallager in 1962. In the Gallager and similar type iterative decoding algorithms, a parity check operation is performed on a codeword "c", where the parity-checked codeword "c" satisfies a parity check equation, such as (e.g.), $H \cdot c^T = 0$, where H denotes a parity check matrix, and $c^T$ denotes a transpose matrix for the codeword "c" updated every iterative decoding cycle. The parity check operation is performed by repeated update through (or up to) a predetermined number of update cycles (or iterations).

The phrase "up to" is used in the above description because an iterative decoding algorithm may be completed (or resolved) before a predetermined, maximum number ("N") of iterative cycles has been executed. On the other hand, there are certain circumstances wherein the maximum number of update cycles will be executed before resolution of the iterative decoding algorithm. In such circumstances where the iterative decoding algorithm does not reach resolution before the maximum number of iterative decoding cycles has been reached, a "last or Nth codeword" stored in memory locations designated for iterative computational results, hereafter terms "variable nodes", is output as a final decoding result. In some applications or circumstances, such an "Nth codeword as final decoding result" outcome may be sufficient. However, other outcomes may arise.

For example, if a corresponding bit error rate for the data being iteratively decoded generally decreases with an increasing number of iterative decoding cycles, but then increases upon execution of the last (Nth) iterative decoding cycle, then the bit error rate associated with Nth iterative decoding cycle may actually exceed a predefined minimum bit error rate. Thus, it is possible for a constituent iterative decoding algorithm to exhibit excellent performance characteristics during its execution, and yet result in an error-floor phenomenon wherein late stage (or last stage) performance improvements abruptly slowed given a high signal-to-noise ratio (SNR) environment. This type of error-floor phenomenon limits the overall utility of the iterative decoding algorithm.

SUMMARY

Embodiments of the present invention provide an iterative decoding method and apparatus capable of reducing overall bit error rates without generating an error-floor phenomenon.

According to one aspect of the present invention, an iterative decoding method, comprises; sequentially executing a number of iterative decoding cycles in relation to a parity check equation until the parity check equation is resolved, or a maximum number N of iterative decoding cycles is reached, during execution of the number of iterative decoding cycles, storing in a data buffer minimum estimated values for a set of variable nodes corresponding to a minimum number of bit errors, and outputting the minimum estimated values stored in the data buffer as a final decoding result when the number of iterative decoding cycles reaches N.

In a related aspect, the parity check equation is defined as $(H \cdot Cm^T)$, where H is a parity matrix corresponding to a bipartite graph comprising a first set probability values for variable nodes Vi and a second set of probability values for check nodes Cj, and Cm is an estimated value matrix for a received codeword updated over a current number of iterative decoding cycles T.

In another aspect, the minimum number of bit errors occurs when a number of check nodes not satisfying the parity check equation is zero ($H \cdot Cm^T = 0$).

In another aspect of the present invention, a computer readable recording medium having recorded thereon a computer program which when executed implements an iterative decoding method comprises; sequentially executing a number of iterative decoding cycles in relation to a parity check equation until the parity check equation is resolved, or a maximum number N of iterative decoding cycles is reached, during execution of the number of iterative decoding cycles, storing in a data buffer minimum estimated values for a set of variable nodes corresponding to a minimum number of bit errors, and outputting the minimum estimated values stored in the data buffer as a final decoding result when the number of iterative decoding cycles reaches N.

In another aspect of the present invention, an iterative decoding apparatus comprises; a data buffer; and a decoding block configured to sequentially execute a number of iterative decoding cycles in relation to a parity check equation until the parity check equation is resolved, or a maximum number N of iterative decoding cycles is reached, wherein during the execution of the number of iterative decoding cycles the decoding block is further configured to store in the data buffer minimum estimated values for a set of variable nodes corresponding to a minimum number of bit errors, and output the minimum estimated values stored in the data buffer as a final decoding result when the number of iterative decoding cycles reaches N.

BRIEF DESCRIPTION OF THE DRAWINGS

The above and other features and advantages of the present invention will become more apparent by describing in detail exemplary embodiments thereof with reference to the attached drawings in which.

DESCRIPTION OF EMBODIMENTS

This application claims the benefit of Korean Patent Application No. 10-2008-0053150 filed on Jun. 5, 2008, the subject matter of which is hereby incorporated by reference.

Certain embodiments of the invention will now be described with reference to the accompanying drawings. The invention may, however, be embodied in many different forms and should not be construed as being limited to only the illustrated embodiments. Rather, the illustrated embodiments are presented as teaching examples.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Figure 1:
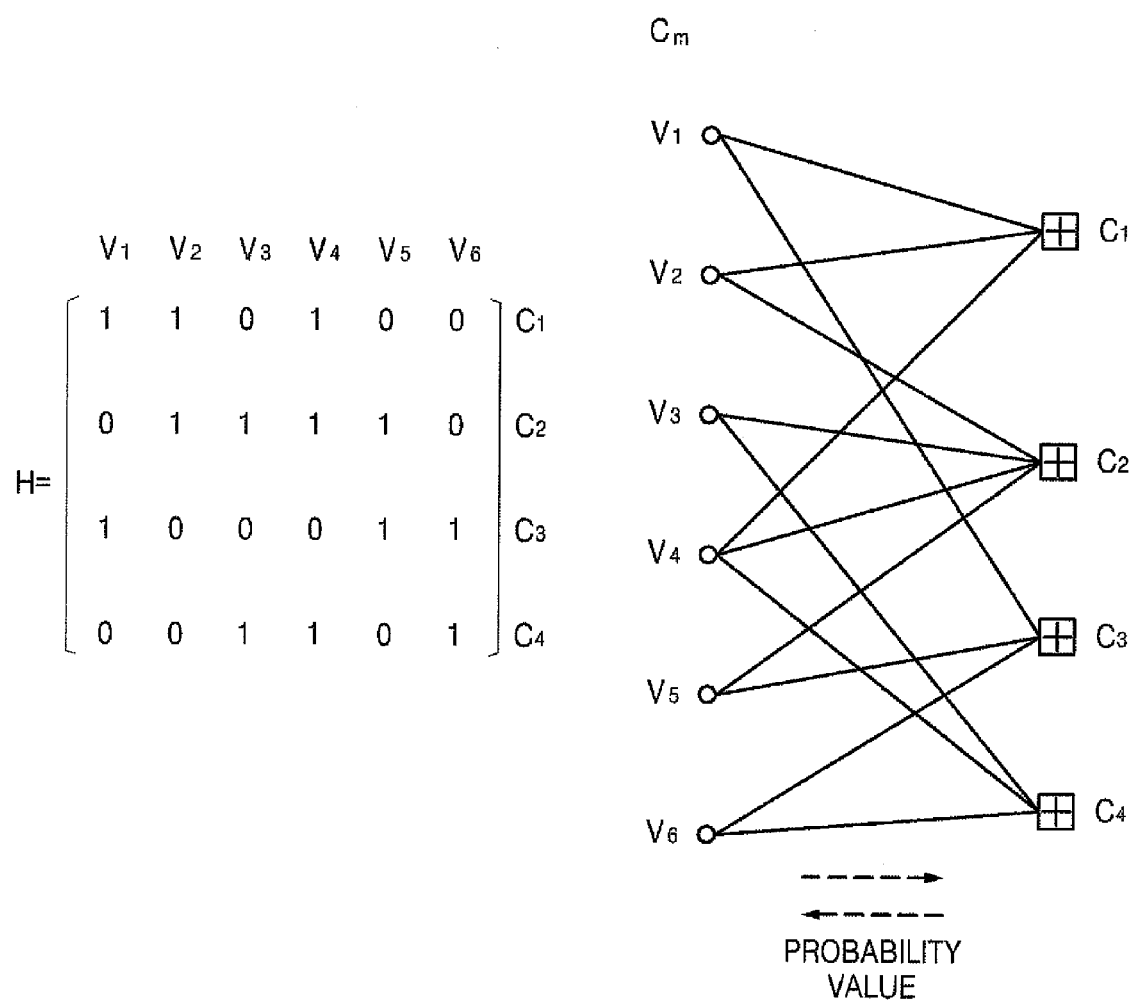
FIG. 1 illustrates a general parity check matrix and a bipartite graph.

FIG. 1 illustrates a general parity check matrix "H" and a corresponding bipartite graph. As illustrated in FIG. 1, columns and rows of the general parity check matrix H correspond to variable nodes "Vi" and check nodes "Cj", respectively, of the bipartite graph, where "i" varies from 1 to M, and "j" varies from 1 to P. A bit node that represents a probability value for a received codeword or a probability value for a decoded codeword generated every iterative decoding corresponds to a particular variable node.

For example, during decoding of low density parity check (LDPC) codes, probability values for a codeword received via a channel are updated while being repeatedly exchanged between variable nodes v1 through v6 and check nodes c1 through c4 as illustrated on the bipartite graph of FIG. 1. For example, a sum-product algorithm may be used in a process of repeatedly updating probability values so that the exemplary nodes of FIG. 1 converge to a codeword satisfying a defined parity check equation while exchanging the probability values between connected nodes on a bipartite graph.

Figure 2:
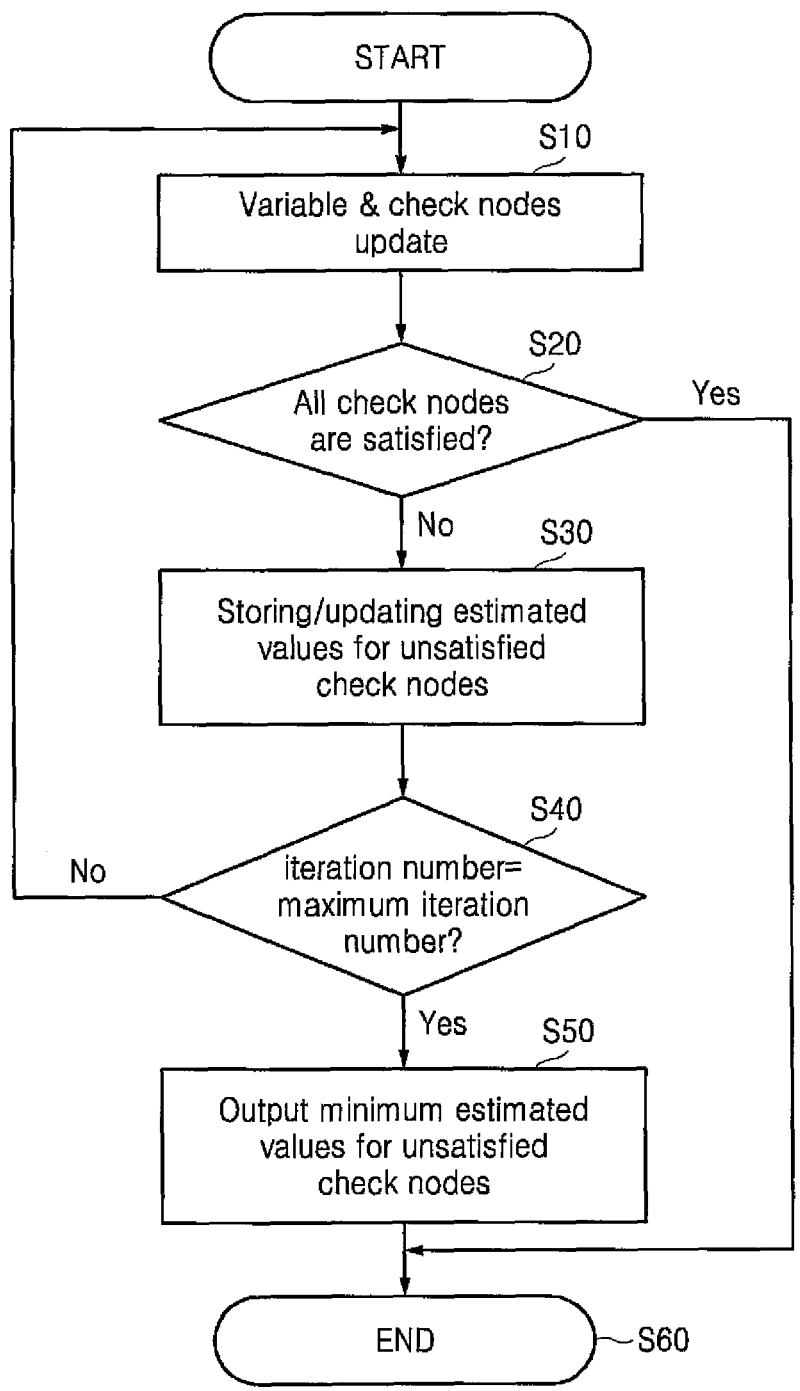
FIG. 2 is a flowchart of a decoding method according to an embodiment of the present invention.
Figure 3:
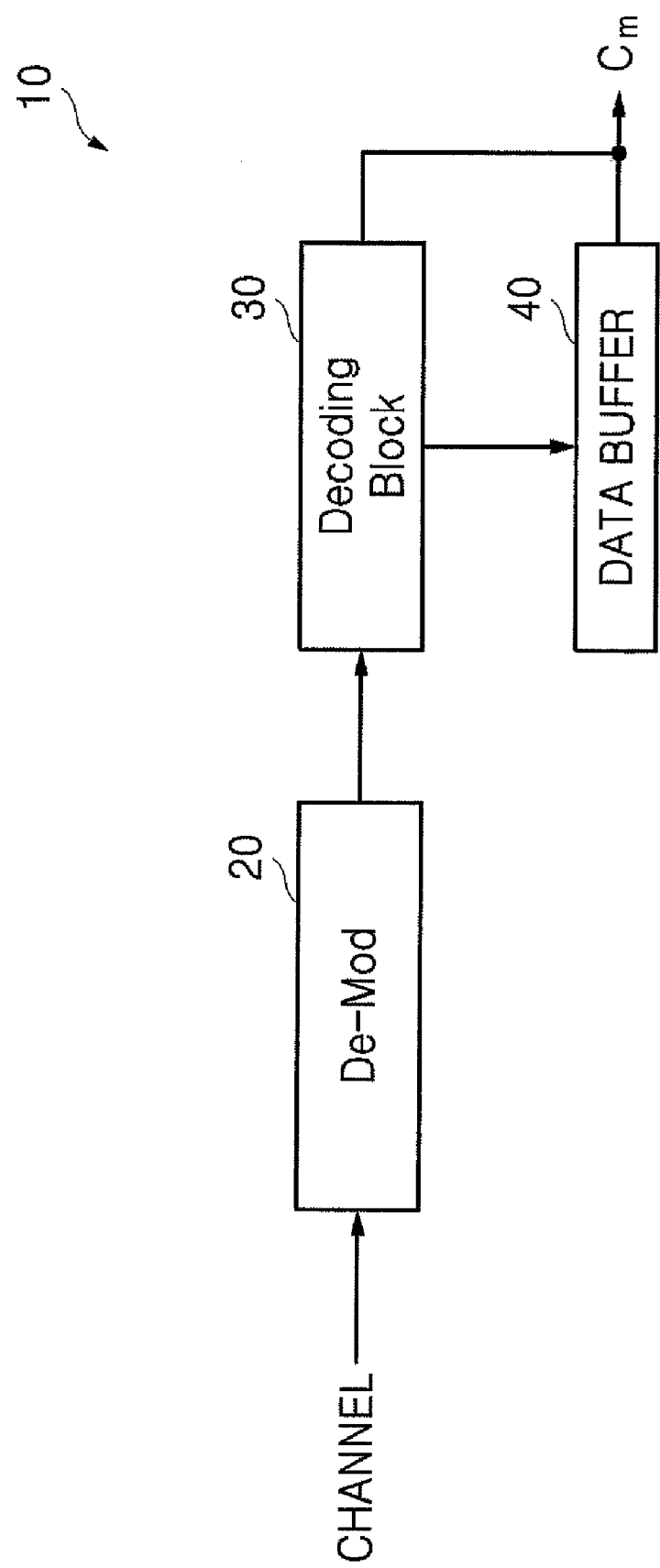
FIG. 3 is a schematic block diagram of a decoder capable of performing the decoding algorithm of FIG. 2.

FIG. 2 is a flowchart of an exemplary decoding method according to an embodiment of the present invention. FIG. 3 is a schematic block diagram of a decoder 10 capable of executing the decoding algorithm of FIG. 2. The decoder 10 may be used, for example, in a receiver of a digital video broadcast (DVB) system, a digital satellite broadcast system, an Intelsat communication system, a space telemetry system, a wireless broadcast system, an ADSL transceiver, a data storage & retrieval system, etc.

Referring collectively to FIGS. 1 through 3, a decoding block 30 of the decoder 10 updates a probability value for each of the variable nodes v1 through v6 and a probability value of each of the check nodes c1 through c4 while exchanging the probability values between the variable nodes v1 through v6 and the check nodes c1 through c4 connected to each other on the bipartite graph of FIG. 1 during each iterative decoding (S10). For example, in certain embodiments of the invention, the probability values between the variable nodes v1 through v6 and the check nodes c1 through c4 may be expressed as Log Likelihood Ratios (LLRs) or Likelihood Ratios (LRs). The decoding block 30 performs the update operation every iterative decoding cycle until a parity check equation is satisfied. A number of iterative decoding cycles executed will not exceed a defined maximum number of iterative decoding cycles. If the parity check equation is not satisfied during an update operation, the decoding block 30 performs another update operation until the maximum number of iterative decoding cycles has been executed.

The decoding block 30 may update the probability value of each of the variable nodes v1 through v6 and the probability value of each of the check nodes c1 through c4 using one or more conventionally-understood, iterative decoding algorithm(s), such as bit-flipping, sum-product, or min-sum.

During a first iterative decoding cycle, the decoding block 30 determines whether a parity check equation, such as for example $H \cdot Cm^T = 0$, is satisfied by performing a parity check on an estimated value matrix "Cm" for a codeword (or a received signal demodulated by a demodulator 20) over a number of iterations "T" (S20). That is, in one embodiment of the invention an estimated value matrix Cm containing a set of estimated values (e.g., respective data values of "0" or "1") and associated with the variable nodes v1 through v6 may be used in relation to the general parity check matrix H. In the working embodiment, it is assumed that the parity check equation is a check equation capable of calculating a number of error bits.

If the parity check equation is satisfied (S20=yes; which is referred to as a case where "all check nodes are satisfied"), the decoding block 30 outputs the estimated values of the variable nodes v1 through v6 as final decoding results—although the maximum number of iterative decoding cycles have not yet been performed—and terminates the iterative decoding method (S60). In one embodiment of the invention with one assumed parity check equation, 0 denotes a zero (or resolved) matrix.

On the other hand, if the parity check equation is not satisfied (S20=no; which is referred to as a case where "all check nodes are not satisfied"), the decoding block 30 stores the number of check nodes not satisfying the parity check equation and the estimated values of the variable nodes v1 through v6 in a data buffer 40 (S30).

During second and subsequent iterative decoding cycles, the variable & check update step S10 (i.e., the decoding block 30 updates the probability value for each of the variable nodes v1 through v6 and the probability value of each of the check nodes c1 through c4) on condition that the maximum number of iteration decoding cycles "N" has not been reached (S40=no). As with the first iterative decoding cycle, if the decoding block 30 resolves the parity check equation during the second or subsequent iterative decoding cycles by (e.g.) performing a parity check on an estimated value matrix Cm for a current codeword (e.g., a received signal), then the decoding block 30 outputs the updated estimated values of the variable nodes v1 through v6 as final decoding results.

On the other hand, during the second or subsequent iterative decoding cycle, if it is determined that the parity check equation is not satisfied (S20=no), the decoding block 30 calculates the number of check nodes not satisfying the parity check equation (for example, a data value of "1" on a row matrix calculated by $H \cdot Cm^T$), then compares the number of unsatisfied check nodes calculated during the current iterative decoding cycle with the number of unsatisfied check nodes calculated during a previous iterative decoding cycle, and maintains the estimated values of the variable nodes v1 through v6 which have already been stored in the data buffer 40 or updates the stored estimated values with the estimated values of the variable nodes v1 through v6 updated during the second iterative decoding, according to a result of the comparison (S30).

For example, if the number of unsatisfied check nodes calculated during a second (current) iterative decoding cycle (for example, NUC1=3) is less than the number of unsatisfied check nodes calculated during a first (previous) iterative decoding cycle (for example, NUC2=4), the decoding block 30 maintains the estimated values for the variable nodes v1 through v6 which have already been stored in the data buffer 40 during the first (previous) iterative decoding cycle (S30).

On the other hand, if the number of unsatisfied check nodes calculated during the second (current) iterative decoding cycle (for example, NUC1=3) is greater than the number of unsatisfied check nodes calculated during the first (previous) iterative decoding cycle (for example, NUC2=2), decoding block 30 updates the estimated values for the variable nodes v1 through v6 previously stored in the data buffer 40 during the first) previous) iterative decoding cycle using "current" estimated values for the variable nodes v1 through v6 derived during the second (current) iterative decoding cycle (S30).

Assuming non-resolution at the second iterative decoding cycle, during a third (next) iterative decoding cycle (S10), the decoding block 30 again updates the probability values for each of the variable nodes v1 through v6 and the probability value of each of the check nodes c1 through c4. During the third (next) iterative decoding, the decoding block 30 again determines whether the parity check equation is satisfied by (e.g.) performing a parity check on an estimated value matrix Cm for an updated codeword (S10) using the general parity check matrix H (S20). If the parity check equation is satisfied, the decoding block 30 outputs the updated estimated values of the variable nodes v1 through v6 as final decoding results even if the maximum number of iterative decoding cycles has not been reached, and then terminates the iterative decoding method (S60).

On the other hand, during the third (next) iterative decoding cycle, if it is determined (S20) that the parity check equation is not satisfied, the decoding block 30 calculates the number of check nodes not satisfying the parity check equation, compares the number of unsatisfied check nodes calculated during the third (next) iterative decoding cycle with a minimum value derived from the numbers of unsatisfied check nodes determined during the first (previous) and second (current) iterative decoding cycles, and either stores the estimated values of the variable nodes v1 through v6 which have already been stored in the data buffer 40 or updates the already-stored estimated values with the estimated values of the variable nodes v1 through v6 updated during the third iterative decoding according to the comparison result (S30).

For example, if a minimum value of (for example, NMIN=3) from among the numbers of unsatisfied check nodes determined during the first and second iterative decoding cycles (i.e., minimum estimated values for the set of variable nodes) is less than the number (for example, NUC3=4) of unsatisfied check nodes calculated during the third (next) iterative decoding, the decoding block 30 maintains the estimated values of the variable nodes v1 through v6 which have already been stored in the data buffer 40 during an iterative decoding operation having the minimum number of unsatisfied check nodes (for example, during the first or second iterative decoding operation; S30).

On the other hand, if the minimum value (for example, NMIN=3) from among the numbers of unsatisfied check nodes calculated during the first and second iterative decoding operations is less than the number (for example NUC3=2) of unsatisfied check nodes calculated during the third iterative decoding, the decoding block 30 updates the estimated values of the variable nodes v1 through v6 which have already been stored in the data buffer 40 during the iterative decoding operation having the minimum number of unsatisfied check nodes (for example, during the first or second iterative decoding operation), with the estimated values of the variable nodes v1 through v6 updated during the third iterative decoding, S30).

In other words, as the cyclic execution of the iterative decoding method proceeds through 1 through N iterative decoding cycles, the decoding block 30 compares the number of check nodes not satisfying the parity check equation during a "current" iterative decoding cycle "k" with a minimum value from among the numbers of check nodes not satisfying the parity check equation determined during the first through previous (k−1) iterative decoding cycles, and either maintains the estimated values for the variable nodes v1 through v6 which have already been stored in the data buffer 40 during the current (k) iterative decoding cycle in view of the minimum number of unsatisfied check nodes determined during the first through previous (k−1) iterative decoding cycles, or updates the stored estimated values with the estimated values of the variable nodes v1 through v6 as updated during the current iterative decoding cycle in accordance with the comparison results (S30).

Using this iterative updating approach through cycles 1 through N, the decoding block 30 may store estimated values for a codeword in the buffer 40 corresponding to a minimum number of corresponding error bits (i.e., when the number of check nodes not satisfying the parity check equation is at a minimum).

When the current iterative decoding cycle reaches the maximum number of iterative decoding cycles N, the decoding block 30 is thus configured to output the estimated values corresponding to when the number of error bits is minimum and output said values form data buffer 40 as the final decoding result (S50).

Figure 4:
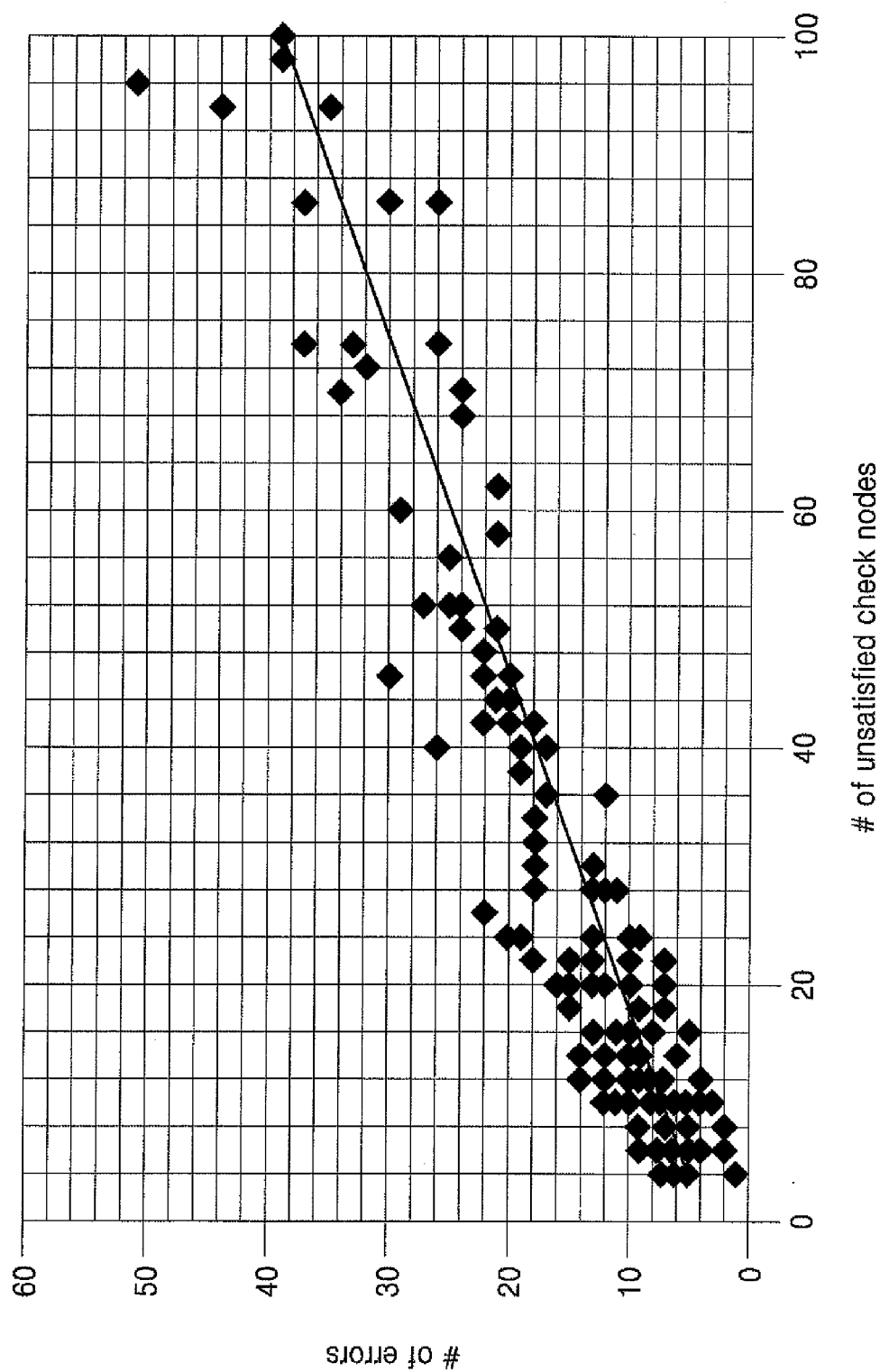
FIG. 4 is a graph showing exemplary statistical characteristics for a number of unsatisfied check nodes as a function of error bits.

FIG. 4 is a graph showing certain statistical characteristics for a number of unsatisfied check nodes and a number of corresponding error bits. As illustrated in FIG. 4, a statistical relation exists between the number of check nodes not satisfying the parity check equation and the number of error bits, and thus the number of error bits stochastically decreases as the number of check nodes not satisfying the parity check equation decreases.

Accordingly, in the cases where the iterative decoding method reaches a defined maximum number of iterative decoding cycles, a decoding block 30 designed and programmed in accordance with an embodiment of the invention will not output as a final decoding result estimated values for variable nodes corresponding to non-minimum error bits, thereby precluding the error-floor phenomenon. Thus, in an iterative decoding method (and corresponding decoder circuit 10) according to an embodiment of the invention, the overall bit error rate will be reduced even in circumstances conventionally generating an error-floor phenomenon when conventional iterative decoding methods are used.

Figure 5:
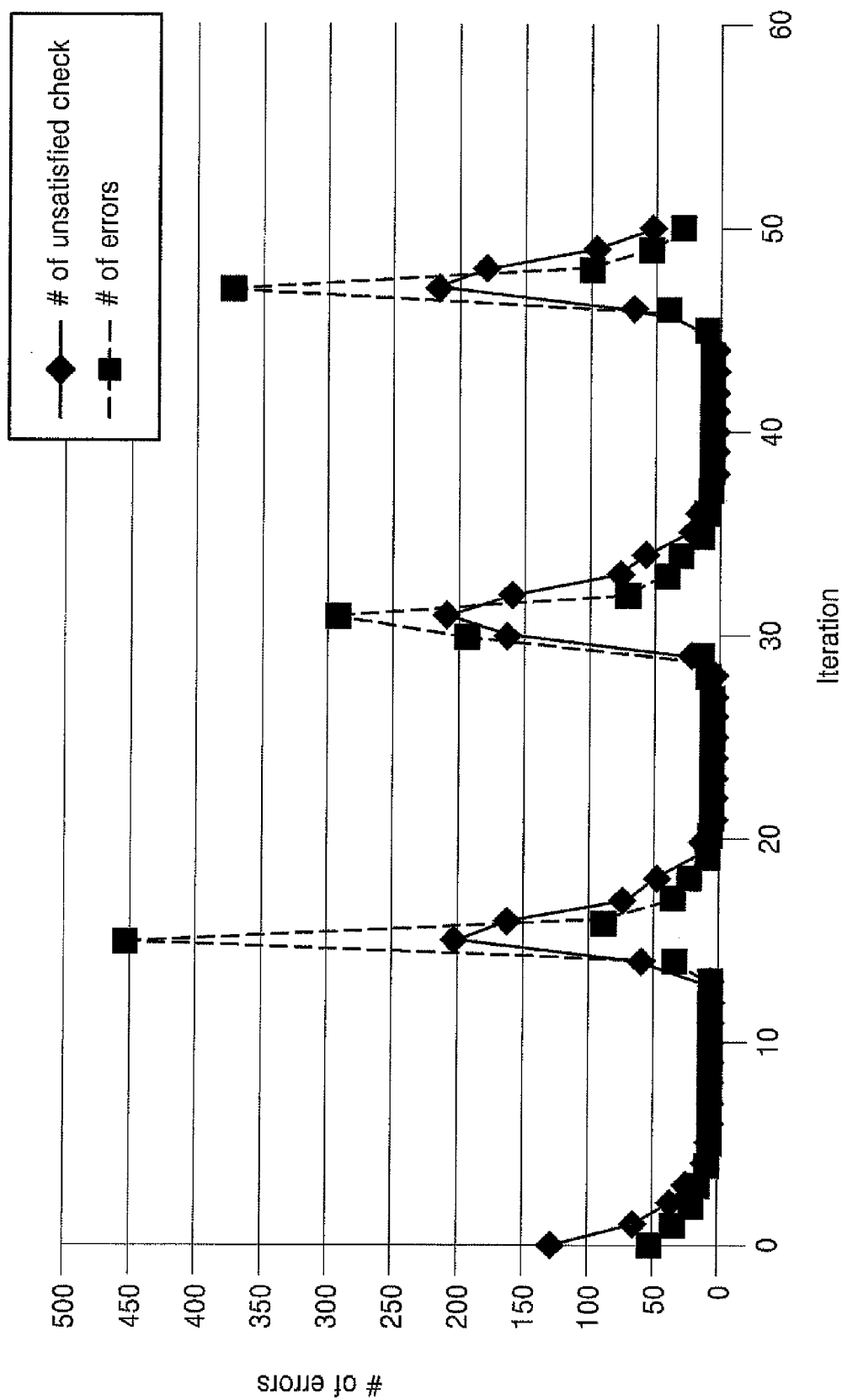
FIG. 5 is a graph showing a relationship between unsatisfied check nodes and error bits as a function of iterative decoding cycles.

FIG. 5 is a graph showing a relationship between the number of unsatisfied check nodes and the number of error bits as a function of a number of iterative decoding cycles performed. Referring to FIG. 5, as the number of unsatisfied check nodes increases, the number of error bits increases.

Figure 6:
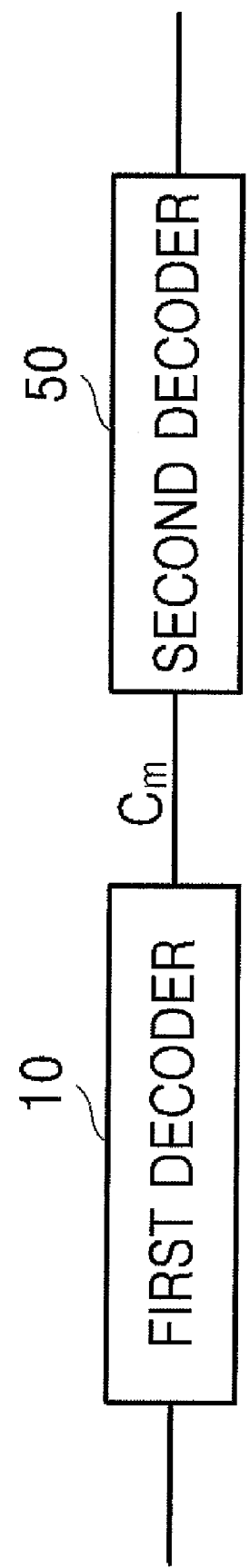
FIG. 6 is a schematic block diagram of a decoding system having a structure capable of reducing the generation of an error-floor phenomenon according to an embodiment of the invention.

FIG. 6 is a schematic block diagram of one general decoding system having a structure capable of reducing the likelihood error-floor phenomenon generation. Referring to FIG. 6, a first decoder 10 is capable of executing iterative decoding methods, such as those described above with reference to FIGS. 2 and 3, and a second decoder 50 is capable of executing one or more conventional error correction techniques.

For example, the first decoder 10 may be implemented as a decoder using an iterative decoding algorithm, for example, an LDPC decoder, an irregular repeat accumulate (IRA) decoder, or a zigzag decoder, and the second decoder 50 may be implemented as a decoder having t or a predetermined number of error correction capabilities, for example, a Bose-Chaudhuri-Hocquenghem (BCH) decoder, a Reed-Solomon decoder, or a Reed-Muller (RM) decoder.

As described above, if an the iterative decoding operation reaches a maximum number of iterative decoding cycles, the first decoder 10 using the foregoing iterative decoding method will output a final decoding result that correlates to estimated values stored in the data buffer 40 when the number of error bits is minimum, (i.e., when the number of check nodes not satisfying the parity check equation is at a minimum).

Accordingly, the probability of significant bit error generation (i.e., a number of bit errors greater than a defined error limit of "t") by first decoder 10 is markedly lower than that of a decoder executing a conventional decoding method. Therefore, a number of residual error bits (less than t) may be conventionally corrected using the second decoder 50. As a result, the overall system bit error rate, as well as the possibility of generating the error-floor phenomenon, may be reduced.

While the present invention has been particularly shown and described with reference to exemplary embodiments thereof, it will be understood by those of ordinary skill in the art that various changes in form and details may be made therein without departing from the scope of the present invention as defined by the following claims.

What is claimed is:

1. An iterative decoding method, comprising:
   sequentially executing a number of iterative decoding cycles in relation to a parity check equation until the parity check equation is resolved, or a maximum number N of iterative decoding cycles is reached;
   during execution of the number of iterative decoding cycles, storing in a data buffer minimum estimated values for a set of variable nodes corresponding to a minimum number of bit errors, wherein the minimum estimated values correspond to a decoding result having a minimum number of error bits; and
   outputting the minimum estimated values stored in the data buffer as a final decoding result when the number of iterative decoding cycles reaches N, wherein the minimum estimated values stored in the data buffer are different from estimated values for the set of variable nodes as determined in a final cycle among the N iterative decoding cycles.

2. The iterative decoding method of claim 1, wherein the parity check equation is defined as (H·CmT), where H is a parity matrix corresponding to a bipartite graph comprising a first set probability values for variable nodes Vi and a second set of probability values for check nodes Cj, and Cm is an estimated value matrix for a received codeword updated over a current number of iterative decoding cycles T.

3. The iterative decoding method of claim 2, wherein the minimum number of bit errors occurs when a number of check nodes not satisfying the parity check equation is zero (H·CmT=0).

4. The iterative decoding method of claim 3, wherein a current iterative decoding cycle k within the number of iterative decoding cycles comprises:
   updating the first set of probability values for the variable nodes Vi and the second set of probability values for the check nodes Cj.

5. The iterative decoding method of claim 4, wherein updating the first set of probability values for the variable nodes Vi and the second set of probability values for the check nodes Cj comprises:
   executing at least one of a group of iterative decoding algorithms consisting of bit-flipping, sum-product, and min-sum.

6. The iterative decoding method of claim 4, wherein the current iterative decoding cycle "k" further comprises:
   determining whether all check nodes Cj are satisfied; and
   if all check nodes are satisfied, outputting a final decoding result and terminating the iterative decoding method.

7. The iterative decoding method of claim 6, wherein if all check nodes are not satisfied, storing/updating estimated values for unsatisfied check nodes in the data buffer.

8. The iterative decoding method of claim 7, following the storing/updating of the estimated values for unsatisfied check nodes, determining whether the current iterative decoding cycle k is equal to N; and
   if the current iterative decoding cycle k is equal to N, outputting the stored estimated values as a final decoding result.

9. The iterative decoding method of claim 7, wherein storing/updating estimated values for unsatisfied check nodes in the data buffer comprises:
   updating stored estimated values in the data buffer for unsatisfied check nodes derived during previous iterative decoding cycles 1 through k–1 when current estimated values derived during the current iterative decoding cycle k for unsatisfied check nodes are less than the stored estimated values, else;
   maintaining the stored estimated values in the data buffer.

10. The iterative decoding method of claim 9, following the storing/updating of the estimated values for unsatisfied check nodes, determining whether the current iterative decoding cycle k is equal to N; and
    if the current iterative decoding cycle k is equal to N, outputting the stored estimated values as a final decoding result.

11. The iterative decoding method of claim 1, wherein the final decoding result includes bit errors less than a defined maximum number of bit errors, and the method further comprises:
    performing an error detection and correction method on the final decoding result to correct the bit errors.

12. A non-transitory computer readable recording medium having recorded thereon a computer program which when executed implements an iterative decoding method comprising:
    sequentially executing a number of iterative decoding cycles in relation to a parity check equation until the parity check equation is resolved, or a maximum number N of iterative decoding cycles is reached;
    during execution of the number of iterative decoding cycles, storing in a data buffer minimum estimated values for a set of variable nodes corresponding to a minimum number of bit errors, wherein the minimum estimated values correspond to a decoding result having a minimum number of error bits; and outputting the minimum estimated values stored in the data buffer as a final decoding result when the number of iterative decoding cycles reaches N, wherein the minimum estimated values stored in the data buffer are different from estimated values for the set of variable nodes as determined in a final cycle among the N iterative decoding cycles.

13. The computer readable recording medium of claim 12, wherein the parity check equation is defined as (H·CmT), where H is a parity matrix corresponding to a bipartite graph comprising a first set probability values for variable nodes Vi and a second set of probability values for check nodes Cj, and Cm is an estimated value matrix for a received codeword updated over a current number of iterative decoding cycles T.

14. The computer readable recording medium of claim 13, wherein the minimum number of bit errors occurs when a number of check nodes not satisfying the parity check equation is zero (H·CmT=0).

15. The computer readable recording medium of claim 14, wherein a current iterative decoding cycle k within the number of iterative decoding cycles comprises:

updating the first set of probability values for the variable nodes Vi and the second set of probability values for the check nodes Cj.

16. An iterative decoding apparatus comprising:

a data buffer; and a decoding block configured to sequentially execute a number of iterative decoding cycles in relation to a parity check equation until the parity check equation is resolved, or a maximum number N of iterative decoding cycles is reached, wherein during the execution of the number of iterative decoding cycles the decoding block is further configured to store in the data buffer minimum estimated values for a set of variable nodes corresponding to a minimum number of bit errors, wherein the minimum estimated values correspond to a decoding result having a minimum number of error bits, and output the minimum estimated values stored in the data buffer as a final decoding result when the number of iterative decoding cycles reaches N, wherein the minimum estimated values stored in the data buffer are different from estimated values for the set of variable nodes as determined in a final cycle among the N iterative decoding cycles.

17. The iterative decoding apparatus of claim 16, wherein the parity check equation is defined as (H·CmT), where H is a parity matrix corresponding to a bipartite graph comprising a first set probability values for variable nodes Vi and a second set of probability values for check nodes Cj, and Cm is an estimated value matrix for a received codeword updated over a current number of iterative decoding cycles T.

18. The iterative decoding apparatus of claim 17, wherein the minimum number of bit errors occurs when a number of check nodes not satisfying the parity check equation is zero (H·CmT=0).

19. The iterative decoding apparatus of claim 18, wherein for a current iterative decoding cycle k within the number of iterative decoding cycles, the iterative decoding apparatus is further configured to update a first set of probability values for the variable nodes Vi and a second set of probability values for the check nodes Cj.

20. The iterative decoding apparatus of claim 19, wherein the iterative decoding apparatus is a BCH decoder, a Reed-Solomon decoder, or a Reed-Muller (RM) decoder.

\* \* \* \* \*